United States Patent [19]
Ha

[11] Patent Number: 5,563,077
[45] Date of Patent: Oct. 8, 1996

[54] METHOD OF FABRICATING A THIN FILM TRANSISTOR HAVING VERTICAL CHANNEL

[75] Inventor: Hyoung C. Ha, Kwangmyungsi, Rep. of Korea

[73] Assignee: Hyundai Electronics Industries Co., Ltd., Kyoungkido, Rep. of Korea

[21] Appl. No.: 492,891

[22] Filed: Jun. 20, 1995

Related U.S. Application Data

[62] Division of Ser. No. 52,570, Apr. 23, 1993, abandoned.

[30] Foreign Application Priority Data

Apr. 24, 1992 [KR] Rep. of Korea ............... 1992-6929
Apr. 24, 1992 [KR] Rep. of Korea ............... 1992-6930

[51] Int. Cl.⁶ .................................... H01L 21/336
[52] U.S. Cl. .................... 437/21; 437/41; 257/401; 257/60
[58] Field of Search ................... 437/21, 40 DM, 437/41 DM, 915, 912; 257/401.60

[56] References Cited

U.S. PATENT DOCUMENTS

| | | | |
|---|---|---|---|
| 4,404,578 | 9/1983 | Takafuji et al. ................... | 257/401 |
| 4,449,285 | 5/1984 | Janes et al. ....................... | 437/93 |
| 4,735,918 | 4/1988 | Parsons et al. ................... | 437/90 |
| 4,835,584 | 5/1989 | Lancaster .......................... | 257/330 |
| 4,929,987 | 5/1990 | Einthoven ........................ | 257/330 |
| 4,969,021 | 11/1990 | Thakoor et al. ................. | 257/60 |
| 5,082,795 | 1/1992 | Temple ............................. | 437/41 |
| 5,087,581 | 2/1992 | Rodder ........................ | 437/41 DM |
| 5,391,506 | 2/1995 | Tada et al. ................. | 437/41 DM |
| 5,403,763 | 4/1995 | Yamazaki ......................... | 437/44 |

FOREIGN PATENT DOCUMENTS

| | | | |
|---|---|---|---|
| 60-189969 | 9/1985 | Japan .............................. | 257/60 |
| 1-8670 | 1/1989 | Japan ............................ | 257/401 |
| 2103879 | 2/1983 | United Kingdom ........ | 437/40 DM |

*Primary Examiner*—Mary Wilczewski
*Attorney, Agent, or Firm*—Darby & Darby, P.C.

[57] ABSTRACT

A thin film transistor having a vertical channel provided according to the invention comprises a vertical channel 4B having a sideways angular U-shaped or "⊏" -shaped cross-section; source and drain areas 5 formed respectively in two ends of the channel 4B, and a gate electrode 7 surrounding a gate insulating layer 6 formed on upper and outer sides of the channel except for the source and drain areas. Accordingly, the satisfactory channel length in less area can be obtained and the leakage current can be reduced when the transistor is in Off state.

4 Claims, 5 Drawing Sheets

METHOD OF FABRICATING A THIN FILM TRANSISTOR HAVING VERTICAL CHANNEL

This is a division of application Ser. No. 8/052,570, filed Apr. 23, 1993, now abandoned.

BACKGROUND OF THE INVENTION

The present invention relates to a thin film transistor (TFT) and in particular, to a thin film transistor having a vertical channel in which the satisfactory channel length in less area can be obtained and the leakage current can be reduced when it is in OFF state.

A conventional TFT presently used in semiconductor devices such as a static random access memory (SRAM), liquid crystal display (LCD), etc. has a planar channel generally. In general, such TFT is fabricated by a conventional method including steps of forming a gate electrode on the insulation layer, forming a gate insulation film on the gate electrode, forming a silicon layer on the gate insulation film, and forming channel, source and drain areas by ion implantation processes respectively. However, it is difficult to apply such conventional method in manufacturing SRAM because of increasing the unit cell area. In manufacturing LCD requiring high resolution, increase in unit cell area is caused to deteriorate the resolution. Also, in the case of minimizing the channel length to reduce the unit cell area, it is a problem that the leakage current increases when such fabricated TFT is in OFF state.

SUMMARY OF THE INVENTION

Accordingly, an object of the invention is to provide a thin film transistor having a vertical channel in which the leakage current is significantly reduced when it is in OFF state by increasing the channel length, with reducing the occupying area.

Another object of the invention is to provide a method of making such thin film transistor having a vertical channel.

A thin film transistor having a vertical channel provided according to one embodiment of the invention comprises; a vertical channel having a sideways angular U-shaped or "⊏"-shaped cross-section; source and drain areas formed respectively in two ends of the channel; and a gate electrode surrounding a gate insulating layer formed on upper and outer sides of the channel except for the source and drain areas.

A thin film transistor having a vertical channel provided according to another embodiment of the invention comprises; a vertical channel having a sideways angular U-shaped or "⊏"-shaped cross-section; source and drain areas formed respectively in two ends of the channel; a gate electrode surrounding a gate insulating layer formed on upper, inner and outer sides of the channel except for the source and drain areas.

A method of making a thin film transistor having a vertical channel according to one embodiment of the invention comprises steps of; forming an insulator with a predetermined thickness and width and having a rectangular cross-section on an insulating layer; after depositing a conducting layer, forming a spacer surrounding outer sides of the insulator by etching anisotropically the conducting layer; forming a vertical channel having a sideways angular U-shaped or "⊏"-shaped cross-section by etching one side of the spacer so that the one side of the insulator is exposed; forming a gate insulating layer on upper and outer sides of the channel except for two ends of the channel; forming a gate electrode surrounding the gate insulating layer; and forming source and drain areas in the two ends of the channel by an ion implantation process.

A method of making a thin film transistor having a vertical channel according to another embodiment of the invention comprises steps of; forming an insulator with a predetermined thickness and width and having a rectangular cross-section on an insulating layer; after depositing a conducting layer, forming a spacer surrounding outer sides of the insulator by etching anisotropically the conducting layer; etching one side of the spacer so that the one side of the insulator is exposed; forming a vertical channel having a sideways angular U-shaped or "⊏"-shaped cross-section by eliminating the insulator by an etching process; forming a gate insulating layer on upper, inner and outer sides of the channel except for two ends of the channel; forming a gate electrode surrounding the gate insulating layer; and forming source and drain areas in two ends of the channel by an ion implantation process.

BRIEF DESCRIPTION OF THE DRAWINGS

The present invention will be more clearly understood from the following description with reference to the accompanying drawings in which.

DETAILED DESCRIPTION OF THE INVENTION

Figure 1A:
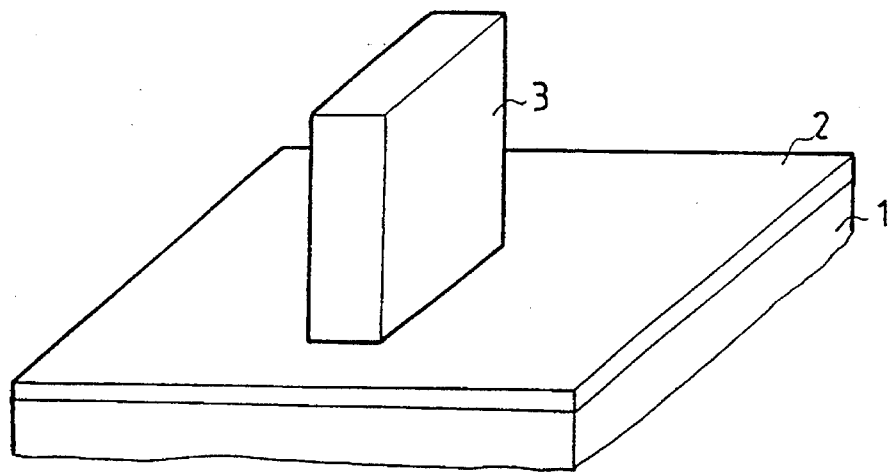
FIGS. 1A to 1D are schematic perspective views illustrating a method of manufacturing a thin film transistor having a vertical channel according to one embodiment of the invention.

FIG. 1A to 1D are schematic perspective views illustrating a method of manufacturing a thin film transistor having a vertical channel according to one embodiment of the invention. As shown in FIG. 1A, an insulator forming step is performed firstly. In this step, an insulator 3 having a predetermined thickness and width is formed on an silicon nitride film 2 deposited on an insulating layer 1 such as oxide film or nitride film. This insulator 3 has a rectangular cross-section.

Figure 1B:
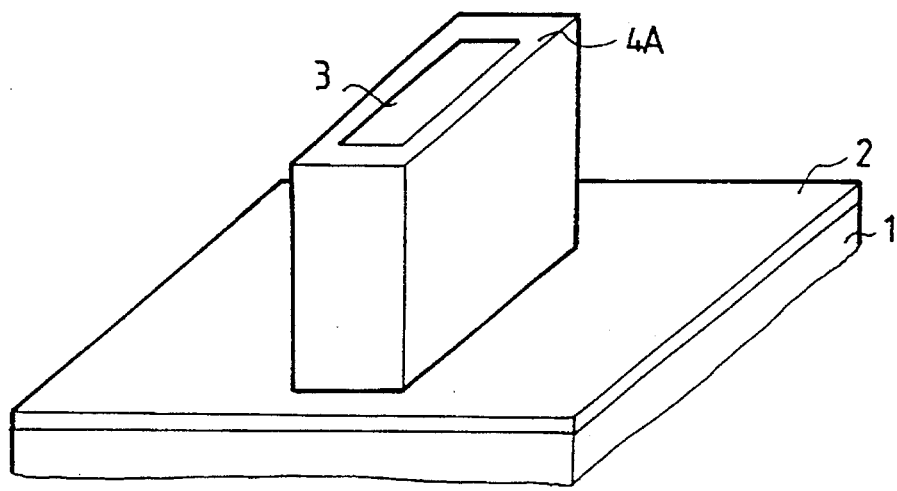

Then, as shown in FIG. 1B, after depositing a silicon layer on overall structure, an anisotropical etching process, for example, blanket etching is performed to form a silicon spacer film 4A surrounding sides of the insulator 3.

Figure 1C:
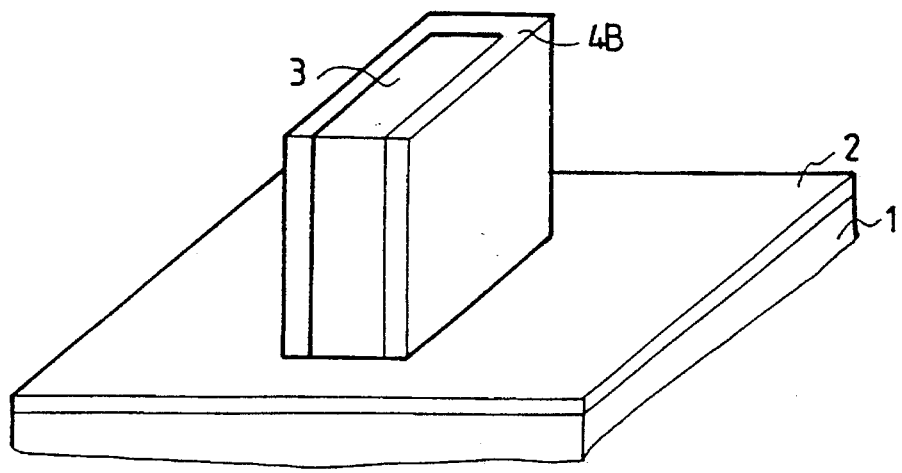

Thereafter, as shown in FIG. 1C, one side of the silicon spacer film 4A is etched so that one side of the insulator 3 can be exposed. Accordingly, a vertical channel 4B having a sideways angular U-shaped or "⊏"-shaped cross-section can be obtained.

Figure 1D:
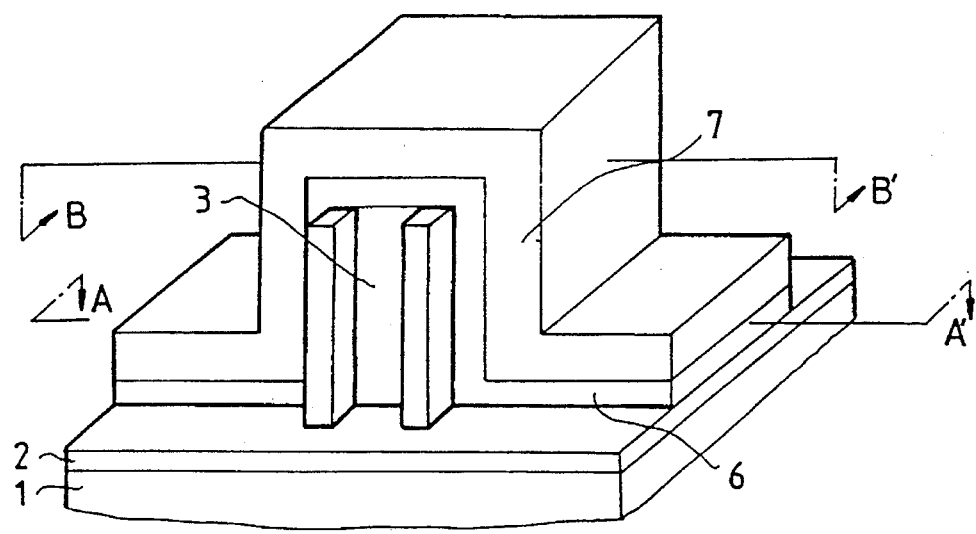

Finally, referring to FIG. 1D, a gate insulating film 6 is formed by depositing silicon oxide on overall structure. Then, after depositing a conducting material, for example, polysilicon, amorphous silicon or silicon on the gate insulating film 6, patterning and etching processes for forming a gate electrode 7 are performed. At this time, the gate electrode 7 is formed on the gate insulating film 6 except for two ends of the channel. Thereafter, source and drain areas 5 are formed in two ends of the channel by an ion implantation process respectively.

Figure 2:
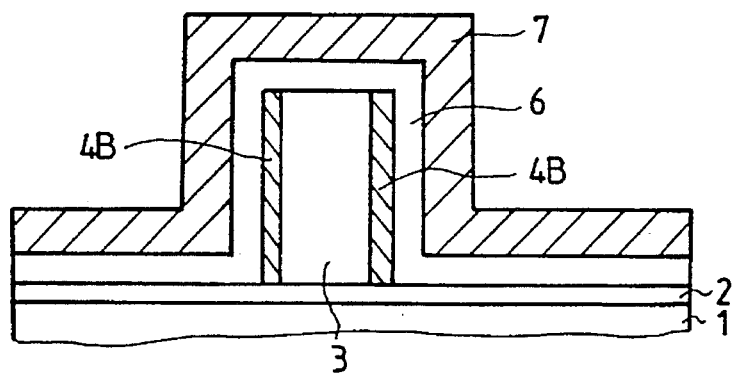
FIG. 2 is a vertical-sectional view taken along the line B–B' of FIG. 1D.
Figure 3:
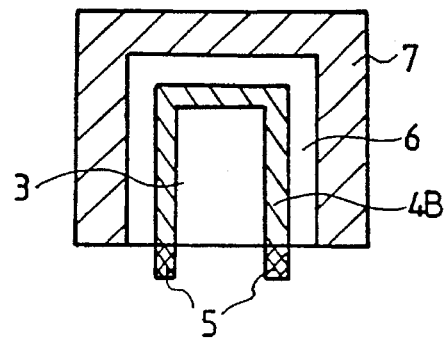
FIG. 3 is a cross-sectional view taken along the line A–A' of FIG. 1D.

Now referring to FIG. 2 illustrating a vertical-sectional view taken along the line B–B' of FIG. 1D, it is understood that by forming the channel 4B along the sides of the insulator 3 having vertical structure, the gate insulating film 6 and the gate electrode 7 surrounding the channel 4B have also vertical structure. Also, referring to FIG. 3 illustrating a cross-sectional view taken along the line A–A' of FIG. 1D, it is easily understood the channel 4B formed according to one embodiment of the invention "⊏"-shaped cross-section. Therefore, because the gate insulating film 6 and the gate electrode 7 surround the upper side and outer sides of the vertical channel 4B having a sideways angular U-shaped or "⊏"-shaped cross-section, it is advantageous to ensure satisfactory channel length in narrow area.

Here-in-after, another embodiment of the invention will be described with reference to FIGS. 4A to 4E, 5 and 6.

Figure 4A:
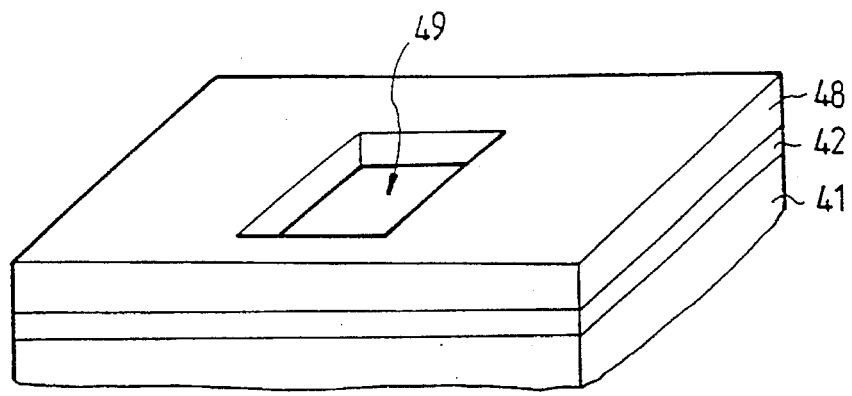
FIGS. 4A to 4E are schematic perspective views illustrating a method of manufacturing a thin film transistor having a vertical channel according to another embodiment of the invention.
Figure 4B:
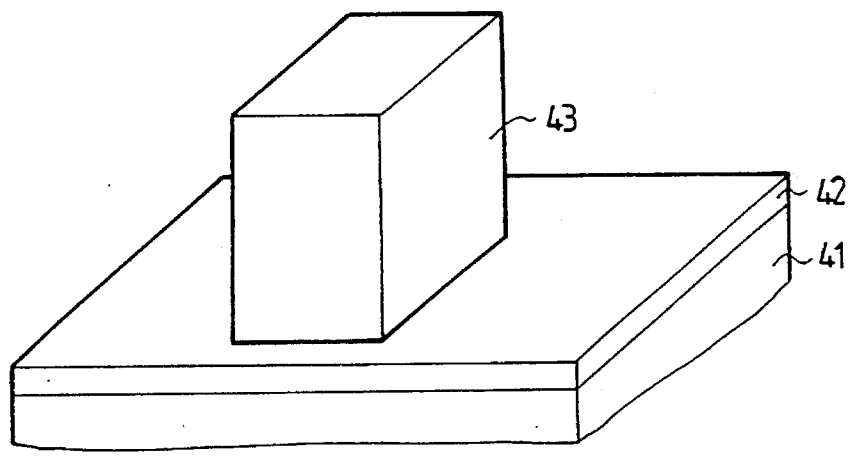

FIG. 4A to 4E are schematic perspective views illustrating a method of manufacturing a thin film transistor having a vertical channel according to another embodiment of the invention. As shown in FIGS. 4A and 4B, an insulator forming step is performed firstly. In this step, a silicon nitride film 42 and a silicon film 48 with a predetermined thickness are deposited sequentially on an insulating layer 41 such as an oxide or nitride film. Then, a portion of the silicon film 48 is etched so that a rectangular groove 49 can be formed. Thereafter, as shown in FIG. 4B, an insulator 43 having a predetermined thickness and width is formed by depositing an insulation material and then by etching the remaining portions of the silicon film 48. This insulator 43 has also a rectangular cross-section.

Figure 4C:
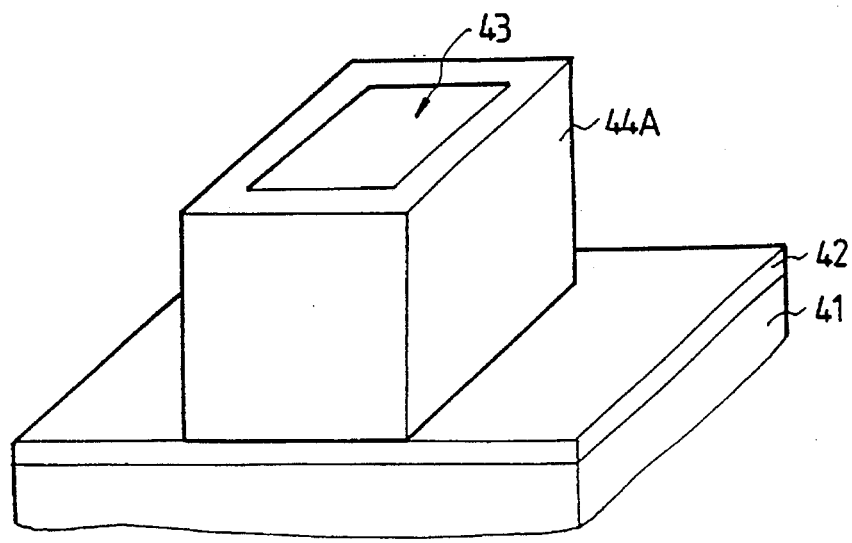

Then, as shown in FIG. 4C, after depositing a silicon layer on overall structure, an anisotropical etching process, for example, blanket etching is performed to form a silicon spacer film 44A surrounding sides of the insulator 43.

Figure 4D:
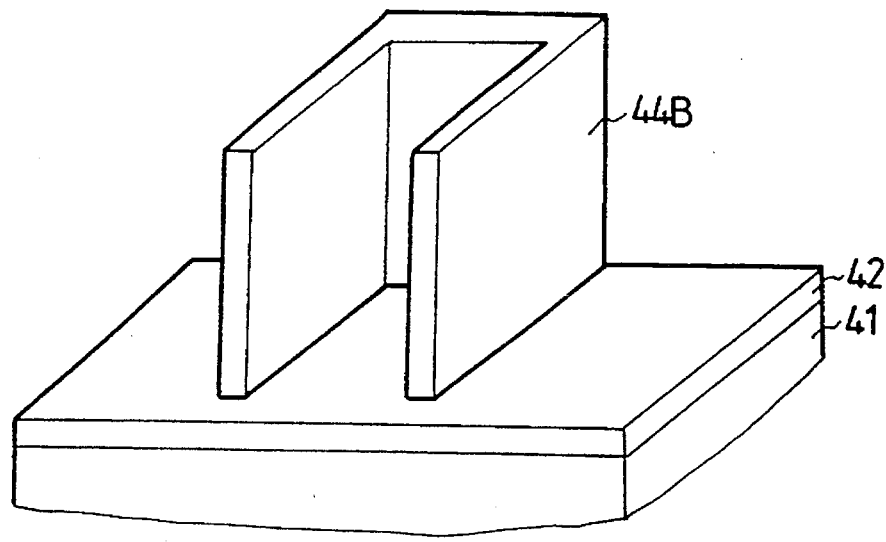

Thereafter, as shown in FIG. 4D, one side of the silicon spacer film 44A is etched so that one side of the insulator 43 can be exposed and then the insulator 43 is eliminated by an etching process. Accordingly, a vertical channel 44B having a sideways angular U-shaped or "⊏"-shaped cross-section can be obtained.

Figure 4E:
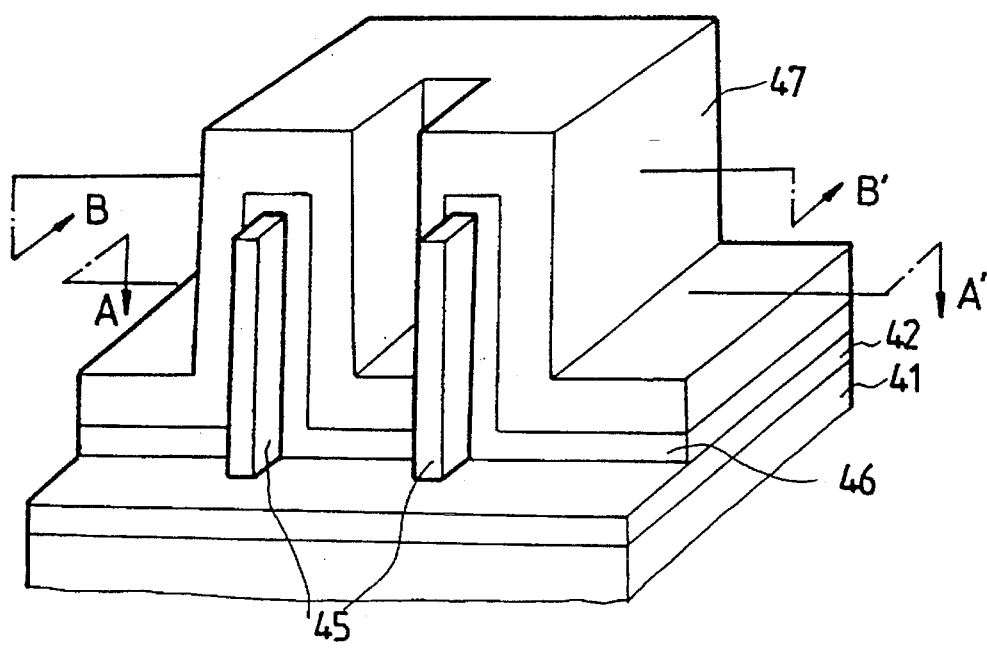

Finally, referring to FIG. 4E, a gate insulating film 46 is formed by depositing silicon oxide on overall structure. Then, after depositing a conducting material, for example, polysilicon, amorphous silicon or silicon on the gate insulating film 46, patterning and etching processes for forming a gate electrode 47 are performed. At this time, the gate electrode 47 is formed on the gate insulating film 46 except for two ends of the channel 44B. Thereafter, source and drain areas 45 are formed in two ends of the channel by an ion implantation process respectively.

Figure 5:
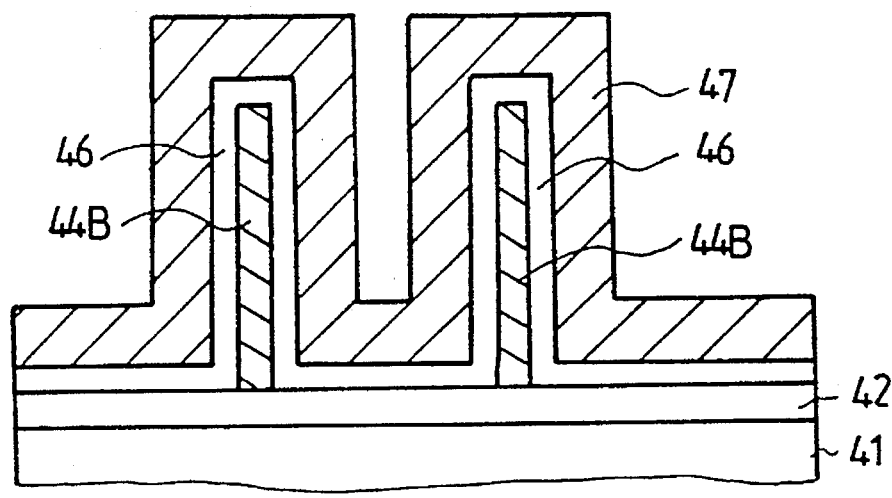
FIG. 5 is a vertical-sectional view taken along the line B–B' of FIG. 4E.
Figure 6:
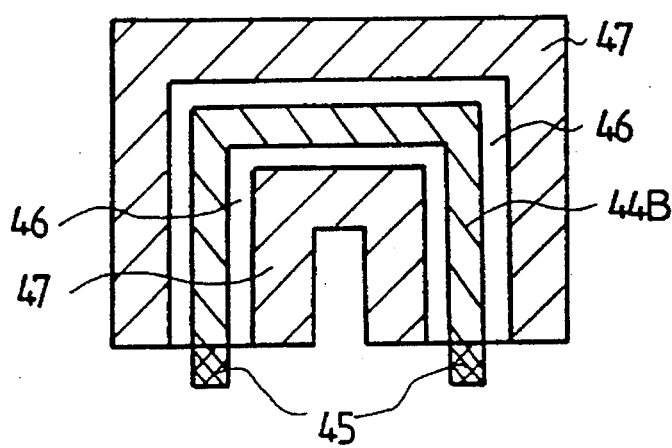
FIG. 6 is a cross-sectional view taken along the line A–A' of FIG. 4E.

Now referring to FIG. 5 illustrating a vertical-sectional view taken along the line B–B' of FIG. 4E, it is understood that by forming the channel 44B along the sides of the insulator 43 having vertical structure, the gate insulating film 46 and the gate electrode 47 surrounding the channel 44B have also vertical structure. Also, referring to FIG. 6 illustrating a cross-sectional view taken along the line A–A' of FIG. 1D, it is easily understood the channel 44B formed according to another embodiment of the invention has also a sideways angular U-shaped or "⊏"-shaped cross-section. Therefore, because the gate insulating film 46 and the gate electrode 47 surround the upper, inner and outer sides of the vertical channel 44B having a sideways angular U-shaped or "⊏"-shaped cross-section, it is advantageous to ensure satisfactory channel length in less area.

Therefore, in a thin film transistor according to the invention, because it has a vertical channel having a "⊏"-shaped cross-section, the satisfactory channel length in less area can be obtained and the leakage current can be reduced when it is in OFF state.

I claim:

1. A method of making a thin film transistor having a vertical channel, comprising the steps of:

forming an insulator with a predetermined thickness and width and having a rectangular cross-section on an insulating layer;

depositing a conducting layer;

after depositing the conducting layer, forming a spacer from the conducting layer surrounding outer sides of the insulator by etching anisotropically the conducting layer;

forming a vertical channel having a sideways angular U-shaped cross-section by etching one side of the spacer so that one side of the insulator is exposed;

forming a gate insulating layer on upper and outer sides of the vertical channel except for two ends of the vertical channel;

forming a gate electrode surrounding the gate insulating layer; and forming source and drain areas in the two ends of the vertical channel by an ion implantation process.

2. A method of making a thin film transistor having a vertical channel according to claim 1, wherein the vertical channel consists of polysilicon or amorphous silicon.

3. A method of making a thin film transistor having a vertical channel, comprising the steps of:

forming an insulator with a predetermined thickness and width and having a rectangular cross-section on an insulating layer;

depositing a conducting layer;

after depositing the conducting layer, forming a spacer from the conducting layer surrounding outer sides of the insulator by etching anisotropically the conducting layer;

etching one side of the spacer so that one side of the insulator is exposed;

forming a vertical channel having a sideways angular U-shaped cross-section by etching the exposed side of the insulator;

forming a gate insulating layer on upper, inner and outer sides of the vertical channel except for two ends of the channel;

forming a gate electrode surrounding the gate insulating layer; and forming source and drain areas in two ends of the vertical channel by an ion implantation process.

4. A method of making a thin film transistor having a vertical channel according to claim 3, wherein the vertical channel consists of polysilicon or amorphous silicon.

* * * * *